United States Patent [19]
Higa et al.

[11] Patent Number: 5,882,805
[45] Date of Patent: *Mar. 16, 1999

[54] CHEMICAL VAPOR DEPOSITION OF II/VI SEMICONDUCTOR MATERIAL USING TRIISOPROPYLINDIUM AS A DOPANT

[75] Inventors: Kelvin T. Higa; Robert W. Gedridge, Jr., both of Ridgecrest, Calif.; Ralph Korenstein, Framingham, Mass.; Stuart JC. Irvine, Hope, United Kingdom

[73] Assignee: The United States of America as represented by the Secretary of the Navy, Washington, D.C.

[ * ] Notice: The term of this patent shall not extend beyond the expiration date of Pat. No. 5,346,852.

[21] Appl. No.: 245,775

[22] Filed: May 18, 1994

[51] Int. Cl.$^6$ ............................... B32B 9/00; C23C 16/00
[52] U.S. Cl. .................. 428/689; 427/255.1; 427/255.2; 427/255; 148/DIG. 64
[58] Field of Search .............................. 427/248.1, 255.1, 427/255.2, 255, 314; 437/185; 428/965, 689; 148/DIG. 64

[56] References Cited

U.S. PATENT DOCUMENTS 5,028,561  7/1991  Kamath et al. ........................ 437/105
5,273,931  12/1993  Taskar et al. ............................ 437/108
5,318,666  6/1994  Elkind et al. ............................ 156/643

OTHER PUBLICATIONS

Journal of Electronic Materials, vol. 22, No. 8 Korenstein et al. published Jun., 1993, "Indium Doping of HgCdTe Grown by Metalorganic Chemical Vapor Deposition–Direct Alloy Growth Using Triisopropylindium and Diisopropyltellurium Adduct" pp. 853–587.

Journal of Electronic Materials, vol. 22, No. 8 S.J.C. Irvine et al. published Jun. 1993. "A New N–Type Doping Precursor for MOCVD–IMP Growth Detector Quality MCT" pp. 859–864.

Journal of Crystal Growth, vol. 124, Nos. 1–4 pp. 88–92 Chen et al. published Aug. 1992. "Triisopropylindium for OMVPE Growth".

*Primary Examiner*—Roy V. King
*Attorney, Agent, or Firm*—Stephen J. Church; Gregory M. Bokar; David S. Kalmbaugh

[57] ABSTRACT

Triisopropylindium $((CH_3)_2CH)_3In$ is used as an n-type dopant for II/VI semiconductor materials. This dopant precursor is particularly suited for indium doping of II/V semiconductor materials at low carrier concentrations in the range of the low $10^{15}$ cm$^{-3}$ and does not exhibit an appreciable memory effect.

13 Claims, No Drawings

CHEMICAL VAPOR DEPOSITION OF II/VI SEMICONDUCTOR MATERIAL USING TRIISOPROPYLINDIUM AS A DOPANT

BACKGROUND OF THE INVENTION

1. Field Of The Invention

The present invention relates in general to the doping of semiconductor materials, and more particularly, to the use of triisopropylindium as a dopant precursor in the chemical vapor deposition of II/VI semiconductor materials.

2. Related Art

The II/VI semiconductor materials such as mercury cadmium telluride (HgCdTe) and cadmium telluride (CdTe) have many applications both in the military as well as the commercial sector. A particularly important application of the II/VI semiconductor materials is in infrared detectors. There exist a variety of binary semiconductor systems such as HgTe and CdTe as well as many ternary and quaternary semiconductor systems that have been investigated for applications in infrared emitters and detectors operating in the 3–5 $\mu$m and 8–12 $\mu$m spectral ranges. These wavelength ranges are particularly important because they are natural windows in the atmosphere for infrared transmission. In addition, many II/VI semiconductor materials are also potential candidates for efficient solar cells and other advanced opto-electronic devices.

Many of these advanced applications require controlled extrinsic doping of both p-type and n-type semiconductor materials. The related art has demonstrated metal-organic chemical vapor deposition (MOCVD) of p-type HgCdTe doped with arsenic using both arsine and tertiarybutylarsine. However, low level doping of n-type HgCdTe in the range of $10^{14}$ atoms per cm$^3$ to $10^{15}$ atoms per cm$^3$, remains more of a problem.

A variety of approaches have been used to control the doping of n-type HgCdTe grown by metal-organic chemical vapor deposition (MOCVD). These include group III doping onto the group II site using Al, Ga and In and group VII doping onto the group VI site using iodine. A common problem with the precursors developed for III–V MOCVD is that their saturated vapor pressures are too high to be handled conveniently as dopant precursors. Lower dopant concentrations can be obtained from an effuser source but there is less flexibility in the range of concentrations from vapor pressure simply controlled by the source temperature. A potentially more serious problem is unwanted reaction processes that cause a memory effect where doping will persist for a number of growth runs following its introduction.

Indium is the dopant of choice for producing n-type HgCdTe due to its slow diffusion in HgCdTe compared to other n-type dopants. It has been used to produce n-type HgCdTe grown by MOCVD using both an interdiffused multilayer process and directed alloy growth. Most of the work to date has utilized trimethylindium as the indium dopant precursor.

However, as disclosed in U.S. patent application Ser. No. 08/027,314, Filed Feb. 25, 1993, now U.S. Pat. No. 5,346,852, there are several problems generally associated with the use of trimethylindium. Since trimethylindium is a solid at or below room temperature, the effective vapor pressure of trimethylindium in a conventional bubbler changes with time due to changes in the surface area of solid. This often results in transport problems. Furthermore, the use of trimethylindium in low temperature processes can result in unintentional carbon impurity incorporation, due to the formation of methyl radicals during pyrolysis, which can be deleterious to the ultimate performance of a semiconductor device.

To that end, trimethylindium is not a suitable precursor for doping HgCdTe at low concentrations. Because of its relatively high vapor pressure the lowest doping achieved to date with trimethylindium is in the mid $10^{16}$ cm$^{-3}$. In addition, trimethylindium has shown a significant 'memory' effect, where indium has been detected in un-doped growths.

Even though trimethylindium has been used successfully as a source compound for indium containing semiconductor materials, trimethylindium has several noted problems when used as a low level n-type dopant in HgCdTe. Thus a given compound which may demonstrate acceptable results when used as a source compound for semiconductor materials does not mean that the same compound can be used as dopant source for semiconductor materials with equally good results.

What is desired is a liquid dopant precursor which can provide a constant quantity of indium and has a very low vapor pressure at reasonable temperatures to allow doping at low carrier concentrations.

SUMMARY OF THE INVENTION

The present invention provides an improved process to introduce indium as a dopant into II/VI semiconductor materials. Triisopropylindium is used as the source of indium dopant in chemical vapor deposition production of II/VI semiconductor materials.

Triisopropylindium has a very low melting point of less than −78° C. and thus is a significantly better indium dopant source than trimethylindium. Specifically, since triisopropylindium is a liquid at very low temperatures, it offers better control of the indium doping process, indium doping at lower temperatures, indium doping at lower concentrations, and a drastic reduction of the memory effect.

An advancement offered by the use of triisopropylindium as an indium doping source is that indium n-type doping of HgCdTe at low levels ($1\times10^{15}$ cm$^{-3}$) has not been possible using the conventional doping source trimethylindium. Doping levels of approximately $1\times10^{17}$ cm$^{-3}$ to $1\times10^{18}$ cm$^{-3}$ are typical with current commercially available reagents. However background doping as high as about mid$\times 10^{17}$ cm$^{-3}$ can be observed due in part to the memory effect that is present when using commercially available reagents such as trimethylindium.

Accordingly, it is an object of the present invention to provide an indium precursor for doping II/VI semiconductor materials such as HgCdTe at carrier concentrations as low as $10^{14}$ cm$^{-3}$ and as high as $10^{19}$ cm$^{-3}$.

Another object of the invention is the use of triisopropylindium as a dopant precursor in the chemical vapor deposition of II/VI semiconductor materials.

A further object of the invention is to provide a liquid indium precursor which has a lower melting point and a much lower vapor pressure than most trialkylindium compounds and other conventional indium precursors.

An advantage of using triisopropylindium as a dopant precursor in the chemical vapor deposition of HgCdTe is that minimal memory doping occurs when the triisopropylindium is properly introduced into the reactor.

These and other objects, features and advantages will become apparent from a thorough consideration of the detailed description which follows.

DETAILED DESCRIPTION OF THE INVENTION

Many indium containing semiconductor materials have been grown by organometallic vapor phase epitaxy (OMVPE) using conventional organo-indium dopant precursors such as trimethylindium, triethylindium, ethyldimethylindium and cyclopentadiethylindium. OMVPE is a high throughput technique for the production of high quality II/VI semiconductor materials and complex structures such as superlattices and focal plane arrays using organometallic precursors.

The most common indium dopant precursor presently employed is trimethylindium. As discussed above, trimethylindium has several disadvantages including a significant memory effect, a variable effective vapor pressure, and an inability to achieve low concentrations of indium doping in HgCdTe.

Triisopropylindium is a much better indium dopant source than trimethylindium. As a liquid, triisopropylindium will typically offer better control of the indium doping process which leads to indium doping at lower concentrations and at lower temperatures.

Triisopropylindium, $((CH_3)_2CH)_3In$, can be prepared by reaction of anhydrous indium chloride ($InCl_3$) with an isopropyl Grignard in an ethereal solvent free of water and oxygen. The general reaction is as follows:

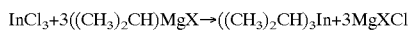

$$InCl_3 + 3((CH_3)_2CH)MgX \rightarrow ((CH_3)_2CH)_3In + 3MgXCl$$

where X is a halide.

A variety of water-free and oxygen-free ethereal solvents can be used in the above reaction, for example, diethyl ether, dipropyl ether, and dibutyl ether. While only theoretical proportions of 3 equivalents of the isopropyl Grignard per equivalent of indium chloride is required, in preferred practice an excess of the Grignard, such as approximately 3.5 equivalents, is used, since the Grignard may not be completely pure. The reaction is conveniently carried out at 0° C. to ambient temperature and pressure. Following the reaction, solvent is removed by vacuum distillation, and the residue is extracted with a saturated alkane, such as pentane or hexane, to extract the triisopropylindium and separate the salts. Such salts are removed by filtration, and the remaining solvent is removed to obtain the desired triisopropylindium product.

The following is an example of preparation of triisopropylindium:

EXAMPLE I

Organic solvents were distilled under Argon from sodium/benzophenone. Synthesis was carried out under purified Argon using inert atmosphere techniques. Reaction flasks were wrapped in aluminum foil to minimize exposure to light. Triisopropylindium, $((CH_3)_2CH)_3In$, was synthesized by reaction of anhydrous indium chloride with 3.5 equivalents of isopropylmagnesium chloride in diethyl ether at ambient temperature and pressure. The diethyl ether was removed under vacuum at room temperature and the residue was extracted with hexane. After filtration, the solvents were removed by fractional vacuum distillation and the crude product was collected in a liquid nitrogen trap. The light-yellow liquid was then heated to approximately 75° C. and refluxed at 3 Torr using a −13° C. condenser for 4 hours in the dark to remove any traces of solvent. The product was then purified by fractional vacuum distillation two more times, first at 60° C. and 2.0 Torr and then at 53° C. and 1.2 Torr to yield an air-sensitive, heat-sensitive and light-sensitive light-yellow pyrophoric liquid in approximately 50–55% yield. The desired compound was confirmed by $^1H$ and $^{13}C$ NMR spectroscopy.

The vapor pressure of trimethylindium is approximately ten times higher at room temperature than that of triisopropylindium but is comparable at approximately −15° C. The advantage of using triisopropylindium at low temperatures, however, is that it is a liquid compared to solid trimethylindium.

The following is an example of the use of triisopropylindium as a dopant precursor according to the invention:

EXAMPLE II

In carrying out the chemical vapor decomposition reaction according to the invention, a suitable reactor is provided containing a heated substrate, which can be any semiconductor substrate such as CdTe or HgCdTe. A flow of the reactants in a carrier gas is directed into the reactor toward the substrate. The temperature of the reactor is sufficiently high to at least partially decompose the reactants. Generally the reaction is carried out at temperatures sufficiently high to at least partially decompose both the Group II and the Group VI source precursor or precursors to deposit the desired II/VI semiconductor materials on the substrate. The reaction temperature in the reactor could range between about 100° C. and 1000° C. and is preferably between 360° C. and 380° C.

Doping was accomplished by introducing triisopropylindium into the reactor simultaneously with the other reactants. In this example, the triisopropylindium was not mixed with any other precursor prior to injection into the growth chamber. For most of the experiments triisopropylindium was maintained at about −15° C. where the compound is a liquid with a vapor pressure of 0.039 torr.

Table I below lists the material characteristics for some of the epilayers grown in this disclosed example. As can be seen, the Hall carrier concentration, ($n_H$), could be varied between the range of low $10^{15}$ cm$^{-3}$ and low $10^{17}$ cm$^{-3}$. This is accomplished by increasing the flow of hydrogen carrier gas through the triisopropylindium bubbler. The material is n-type with electron mobilities consistent with the composition. For the highest doped layer, the reduced mobility can be attributed to ionized impurity scattering.

TABLE I

Characteristics of Indium Doped HgCdTe Semiconducting Material Using Triisopropylindium

| Sample | x | $n_H^{77K}$ (cm$^{-3}$) | $\mu^{77K}$ (cm$^{-3}$) | SIMS Indium (cm$^{-3}$) (surface) | SIMS Indium (cm$^{-3}$) (Interface) |
|---|---|---|---|---|---|
| 1525 | 0.206 | $2.5 \times 10^{15}$ | $2.0 \times 10^5$ | $1.0 \times 10^{15}$ | $4.0 \times 10^{15}$ |
| 1559 | 0.212 | $2.6 \times 10^{15}$ | $9.0 \times 10^4$ | $2.0 \times 10^{15}$ | $3.0 \times 10^{15}$ |
| 1548 | 0.203 | $5.3 \times 10^{16}$ | $9.0 \times 10^4$ | $1.0 \times 10^{16}$ | $2.0 \times 10^{17}$ |
| 1544 | 0.222 | $2.1 \times 10^{17}$ | $4.5 \times 10^4$ | $7.0 \times 10^{16}$ | $7.0 \times 10^{17}$ |

The secondary ion mass spectroscopy (SIMS) profile of sample 1559 revealed that the indium atomic concentration as a function of depth in this 15 μm thick layer is fairly uniform at a value of $2 \times 10^{15}$ atoms cm$^{-3}$ and agrees fairly well with the excess carrier concentration listed in Table 1 indicating near 100% indium activation at this doping concentration. There was only a slight increase in the indium concentration near the substrate interface.

For the higher doped layers (e.g. samples 1548 and 1544), the SIMS profiles generally indicated a grading in the indium concentration. The indium concentration at the interface was typically highest and was decreasing gradually towards the surface or epilayer/air interface. This grading is evidenced in Table 1 as the difference between the SIMS (surface) and SIMS (interface) indium concentrations for each epilayer listed. The Hall carrier concentration ($n_H$), falls somewhere between the surface and the interface indium concentrations. This would indicate that the surface and interface indium content is electrically active n-type.

From the foregoing description, those persons skilled in the art can easily ascertain the essential characteristics of this invention, and without departing from the spirit and scope thereof, can make various changes and modifications in the use of triisopropylindium. Therefore, it is not intended that the scope of this invention be limited to the specific examples described. Rather it is intended that the scope of the invention be determined by appending claims and their equivalents.

What is claimed as the invention is:

1. A process for indium doping of a Group II/Group VI semiconductor material by chemical vapor deposition wherein the indium source is triisopropylindium.

2. The process of claim 1, wherein one or more sources of said Group II material is a compound containing an element selected from the group consisting of cadmium, mercury, and zinc.

3. The process of claim 1, wherein one or more sources of said Group VI material is a compound containing an element selected from the group consisting of sulfur, selenium, and tellurium.

4. The process of claim 1, wherein said Group II/Group VI semiconductor material is selected from the group consisting of binary, ternary and quaternary Group II/Group VI semiconductor materials.

5. The process of claim 1, wherein said indium doping takes place at a temperature ranging from about 100° C. to about 1000° C.

6. The process of claim 1, wherein the indium doping concentration of said doping reaction takes place at a carrier concentration ranging from about $1\times10^{19}$ cm$^{-3}$ to about $1\times10^{14}$ cm$^{-3}$ in said Group II/Group VI semiconductor material.

7. A process for indium doping a Group II/Group VI semiconductor material by chemical vapor deposition which comprises reacting triisopropylindium and one or more sources of a Group II material and one or more sources of a Group VI material by chemical vapor deposition at a temperature sufficiently high to at least partially decompose the triisopropylindium and said Group II and said Group VI source materials, and depositing said Group II/Group VI semiconductor materials on a semiconductor substrate such that minimal indium memory doping occurs.

8. The process of claim 7, wherein said one or more sources of said Group II material is a compound containing an element selected from the group consisting of cadmium, mercury, and zinc.

9. The process of claim 7, wherein said one or more sources of said Group VI material is a compound containing an element selected from the group consisting of sulfur, selenium, and tellurium.

10. The process of claim 7, wherein said Group II/Group VI semiconductor material is selected from the group consisting of binary, ternary and quaternary Group II/Group VI semiconductor materials.

11. The process of claim 7, wherein said indium doping takes place at a temperature ranging from about 100° C. to about 1000° C.

12. The process of claim 7, wherein the indium doping concentration of said doping reaction takes place at a carrier concentration ranging from about $1\times10^{19}$ cm$^{-3}$ to about $1\times10^{14}$ cm$^{-3}$ in said Group II/Group VI semiconductor material.

13. An indium-doped Group II/Group VI semiconductor material deposited on a substrate produced by the process of claim 1, wherein the indium doping concentration of said doping reaction takes place at a carrier concentration ranging from about $1\times10^{19}$ cm$^{-3}$ to about $1\times10^{14}$ cm$^{-3}$ in said Group II/Group VI semiconductor material.

* * * * *